United States Patent [19]

MacChesney et al.

[11] 4,422,898
[45] Dec. 27, 1983

[54] TECHNIQUE FOR THE FABRICATION OF AN IRON OXIDE MASK

[75] Inventors: John B. MacChesney, Stirling; Paul B. O'Connor, Plainfield; Miles V. Sullivan, Summit, all of N.J.

[73] Assignee: Bell Telephone Laboratories, Incorporated, Murray Hill, N.J.

[21] Appl. No.: 384,406

[22] Filed: Jun. 2, 1982

Related U.S. Application Data

[63] Continuation of Ser. No. 934,815, Aug. 18, 1978, abandoned, which is a continuation of Ser. No. 540,398, Jan. 13, 1975, abandoned, which is a continuation of Ser. No. 377,582, Mar. 2, 1973, abandoned, which is a continuation of Ser. No. 29,560, Apr. 17, 1970, abandoned.

[51] Int. Cl.$^3$ .......................... B05D 5/06; B41N 1/24
[52] U.S. Cl. .................................. 156/655; 156/667; 427/143; 427/166; 427/255.3; 427/419.2
[58] Field of Search ................ 156/655, 667; 427/252, 427/343, 143, 166, 248 R, 248 C, 419 A, 255.3, 419.2; 423/633; 430/5

[56] References Cited

U.S. PATENT DOCUMENTS 2,642,339  6/1953  Sawyer .............................. 423/633
2,919,207 12/1959  Scholzel ............................. 427/129

Primary Examiner—Jerome W. Massie
Attorney, Agent, or Firm—Bruce S. Schneider

[57] ABSTRACT

Iron oxide films for "see-through" photomasks are deposited upon heated substrates by chemical vapor deposition from iron pentacarbonyl in the presence of oxygen. The solubility of the iron oxide film is found to be higher, the lower the temperature of the substrate during deposition. At temperatures below 160 degrees C., films are obtained which can be patterned at reasonable rates by photolithographic procedures using conventional mild etchants.

4 Claims, 1 Drawing Figure

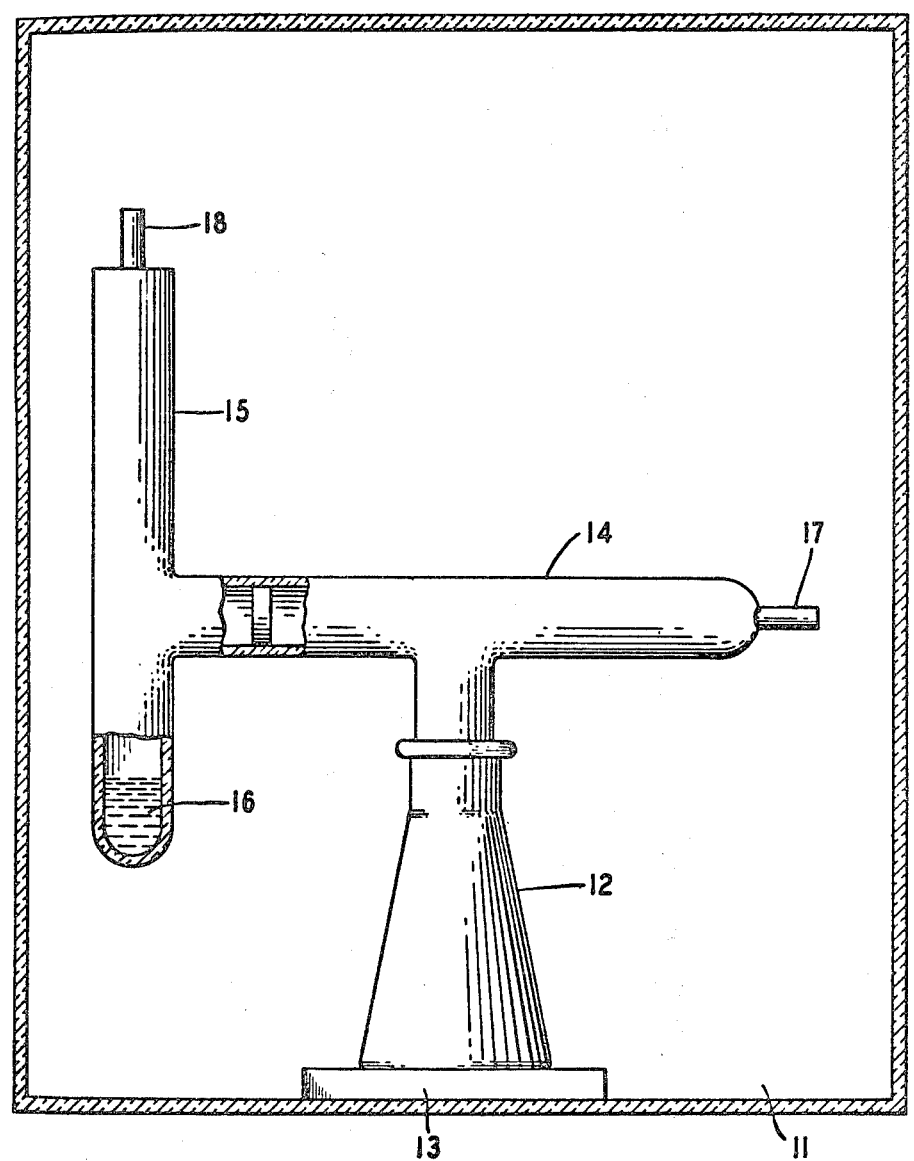

TECHNIQUE FOR THE FABRICATION OF AN IRON OXIDE MASK

CROSS-REFERENCE TO RELATED APPLICATION

This is a continuation of application Ser. No. 934,815, filed Aug. 18, 1978, which was a continuation of application Ser. No. 540,398, Jan. 13, 1975, now abandoned, which was a continuation of application Ser. No. 377,582, filed Mar. 2, 1973, now abandoned, which was a continuation of Ser. No. 29,560, filed Apr. 17, 1970, now abandoned.

BACKGROUND OF THE INVENTION

1. Field of the Invention

This invention relates to a technique for the fabrication of a mask destined for use in resist and lithographic processes. More particularly, the present invention relates to technique for the fabrication of iron oxide photomasks utilizing chemical vapor deposition techniques.

2. Description of the Prior Art

The need for processing localized areas in microcircuit technology has generated a technology directed to the efficacious preparation and utilization of masks to define diffusion, evaporation and related operations. The use of well-known photomask processes for attaining this end has been universally applied in the microcircuit processing industry with varying degrees of success. Typically, such techniques involve the preparation of a suitable photomask defining the pattern of interest and the use of this mask to transfer an image to a photoresist pattern.

Until recently, it had been conventional to form the mask pattern in a photographic emulsion. In numerous applications, the masks so formed are used repetitively and due to the inherent softness of photographic emulsions deteriorate rapidly due to abrasion. Accordingly, workers in the art turned their attention toward the development of masks manifesting greater durability.

This end was attained by the use of hard inorganic opaque materials, typically metal on glass. A popular mask falling within the scope of this class is prepared by evaporating chromium upon a glass substrate and thereafter forming the desired pattern in photoresist on this surface. Thereafter, the pattern is etched into the chromium. These masks have been found to be very durable and manifest a potentially higher resolution capability than photographic emulsion masks, such being attributed both to the thinness of the deposited metal and the lack of grain and thinness in the image defining photoresist. Although satisfactory from many standpoints, such photomasks are opaque and reflect a high percentage of incident radiation including the light normally used during alignment of the photomask with respect to pattern previously imposed on the substrate. Both the opacity and reflectivity contribute to the difficulty of carrying out this alignment, especially on equally reflective metallized substrates. These masks also reflect the light normally used to expose the photoresist after alignment, so creating a problem of fringing with the concomitant loss of resolution at the edges of the pattern due to multiple reflections between the substrate and the photomask.

Reactively sputtering a hard inorganic compound upon a glass substrate and etching the deposited layer to form the desired pattern represented a suggested approach for improved masks. Some transition metal oxides were found promising in being transparent to the light used by the operator to align the photomask with the substrate and highly absorbing at the wavelength used to expose the photoresist on the substrate to be processed. But iron oxide films which were produced in this manner and which had these desirable optical properties were, to the date of the present invention, considered unsuitable for patterning into masks by the usual photoresist processing because of their relative insolubility in the usual etchants compatible with the photoresists.

SUMMARY OF THE INVENTION

In accordance with the present invention, the prior art limitations have been effectively obviated by a novel procedure wherein a layer of iron oxide is deposited upon a heated substrate member at a temperature not exceeding 160 degrees C. by chemical vapor deposition techniques in an oxidizing ambient. Films so deposited are readily etched in solvents compatible with conventional photoresist processing materials.

BRIEF DESCRIPTION OF THE DRAWING

The invention will be more readily understood by reference to the following detailed description taken in conjunction with the accompanying drawing wherein:

The FIGURE is a schematic representation of an apparatus used in the practice of the present invention.

DETAILED DESCRIPTION

With reference now more particularly to the FIGURE, there is shown a schematic representation of an apparatus suitable for use in the practice of the present invention. Shown in the FIGURE is a glove box 11 within which there is disposed a deposition chamber 12, positioned upon a hot plate 13, and connected by means of T conduit 14 to a chamber 15 capable of holding a source solution 16. Conduit 14 additionally includes an inlet 17 which may be used for the introduction of an oxidizing medium thereto during the operation of the process. Chamber 15 also includes an inlet 18 for the introduction thereto of a carrier gas.

In the operation of the process, a suitable substrate, which may be ordinary glass or any well-known material which is transparent, over the range of 3000 to 6000 Angstroms, is inserted within chamber 12 and iron pentacarbonyl introduced into chamber 15. Thereafter, a carrier gas is bubbled through the source solution, so resulting in the transport of the iron pentacarbonyl in vapor form to deposition chamber 12. The carrier gas employed may be selected from among any of the well-known inert gases such as argon, krypton, xenon, helium, carbon dioxide, nitrogen, et cetera. The substrate member of interest is next heated to a temperature within the range of 100 to 160 degrees C. and a quantity of oxygen sufficient to form iron oxide is admitted to the chamber (either as an impurity in the inert gas or from another source), so resulting in the decomposition of the iron pentacarbonyl and deposition upon the surface of the substrate of a layer of iron oxide. Studies have revealed that the use of temperatures less than the noted minimum of 100 degrees C. fail to result in satisfactory decomposition of the iron compound and hence result in inadequate deposition upon the surface of the substrate. Temperatures appreciably in excess of 160 degrees C. have been found to result in the formation of the highly crystalline film typically obtained by sputtering in accordance with the prior art procedure alluded to hereinabove, such crystalline film being capable of being etched only with great difficulty.

As indicated, it is essential in the practice of the present invention that oxygen be present. This may be accomplished by using an impure inert gas or by mixing the iron pentacarbonyl-carrier gas mixture with oxygen or a mixture of oxygen and water vapor. It has been theorized that iron pentacarbonyl reacts with oxygen upon a reactive surface. Water and other molecular species which can be strongly absorbed on the reactive surface suppress the decomposition and consequent film formation. Nonetheless, increasing temperatures free the surface from absorbed water and lead to higher deposition rates. Accordingly, it is evident that the primary purpose of utilizing oxidizing media is to permit greater control of the deposition rate and to assure the formation of iron oxide.

The volume of carrier gas or carrier gas-oxidizing gas mixture is dictated by considerations relating to the desired rate of deposition. It has been found convenient to operate at flow rates of carrier gas within the range of 20 to 80 cubic centimeters per minute. However, it will be understood that such range is not absolute and variations may be made by one skilled in the art without departing from the spirit and scope of the invention. Similarly, flow rates of comparable range may be used with respect to the oxidizing medium when employed. Deposition is continued for a time period calculated to produce the desired thickness for photomask purposes, typically within the range of 1000 to 2000 Angstroms. The resultant iron oxide film is found to be selectively absorbing, typically exhibits less than one percent transmission at a wavelength of 4000 Angstroms and exhibits more than 50 percent transmission at 5890 Angstroms, the wavelength of a sodium lamp which is commonly used to facilitate alignment. Examples of the present invention are set forth below:

EXAMPLE I

A film of iron oxide approximately 1500 Angstroms in thickness was deposited upon a 2×2 inch glass substrate member approximately 60 mils in thickness by the thermal decomposition of iron pentacarbonyl. The procedure involved adding 50 cubic centimeters of iron pentacarbonyl to source chamber 15 in an apparatus similar to that shown in the FIGURE. Thereafter, argon was introduced into the source chamber at a rate of 80 cubic centimeters per minute and bubbled through the iron pentacarbonyl, thereby resulting in its transport to deposition chamber 12 within which was contained the substrate member. The substrate member was heated by means of a hot plate to a temperature of 125 degrees C. for a time period of three minutes, so resulting in the decomposition of the iron pentacarbonyl and the deposition upon the substrate of a layer of iron oxide.

Subsequent to the deposition of the iron oxide film, it was coated with a commercially available photoresist, exposed to a light pattern and developed by conventional commercial techniques. Next, an aqueous solution of hydrochloric acid (typically 5.8 molar at 50 degrees C.) was employed to etch the pattern in the iron oxide film. Etching was completed within 20 seconds.

EXAMPLE II

The procedure of Example I was repeated with the exception that deposition was effected at 105, 115, 130, 140 and 150 degrees C. The time required to effect etching was an inverse function of deposition temperature and ranged from about 15 seconds at 105 degrees C. to 45 seconds at 150 degrees C. It will be appreciated by those skilled in the art that variations in the temperature of the etchant will result in modification of etching rate.

For comparative purposes, an iron oxide photomask of comparable thickness to that described in the examples above obtained by reactive sputtering techniques was subjected to etching in the described manner and the rate of etching was found to be unreasonably long.

Studies of the resultant films reveal that, from the standpoint of scratch resistance, they are as good or better than the chromium masks. The described films were also found to be superior to chromium films in that they are essentially pinhole free.

What is claimed is:

1. In a method for the fabrication of a patterned mask comprising the steps of depositing upon the surface of a substrate a metal oxide layer and etching said layer to form the desired pattern, the improvement which comprises depositing iron oxide on said surface by decomposing iron pentacarbonyl at said surface in the presence of oxygen while the substrate is maintained at a temperature within the range of 100 degrees C. to 160 degrees C.

2. The method of claim 1 in which the temperature of the substrate is maintained within the range of 105 degrees C. to 150 degrees C.

3. The method of claim 1 in which the substrate is maintained at a temperature in the vicinity of 125 degrees C.

4. In a method of fabricating a photomask, made up of a transparent substrate and a patterned layer thereon of a material relatively opaque to light of a wavelength used for exposing photoresists and relatively transparent to visible light of a higher wavelength, said method comprising the steps of depositing a metal oxide layer on the surface of said substrate and selectively etching said layer to form the required pattern, the improvement which comprises depositing iron oxide on said surface by decomposing iron pentacarbonyl at said surface in the presence of oxygen while the substrate is maintained at a temperature within the range of 100 degrees C. to 160 degrees C., within which the iron oxide layer is deposited in a form which is soluble in etchants compatible with photoresist processing.

* * * * *